(12) United States Patent
Raab et al.

(10) Patent No.: US 9,960,569 B2
(45) Date of Patent: May 1, 2018

(54) METHOD FOR STABILIZING A DIODE LASER

(71) Applicant: TOPTICA Photonics AG, Graefelfing (DE)

(72) Inventors: Christoph Raab, Munich (DE); Andreas Able, Wolnzach (DE); Rainer Heidemann, Munich (DE)

(73) Assignee: TOPTICA Photonics AG, Graefelfing (DE)

( * ) Notice: Subject to any disclaimer, the term of this patent is extended or adjusted under 35 U.S.C. 154(b) by 0 days. days.

(21) Appl. No.: 14/659,831

(22) Filed: Mar. 17, 2015

(65) Prior Publication Data

US 2015/0270683 A1   Sep. 24, 2015

(30) Foreign Application Priority Data

Mar. 18, 2014 (DE) .................. 10 2014 003 756
Mar. 12, 2015 (DE) .................. 10 2015 103 630

(51) Int. Cl.
*H01S 5/0687* (2006.01)
*H01S 5/14* (2006.01)
(Continued)

(52) U.S. Cl.
CPC ............ *H01S 5/0687* (2013.01); *H01S 5/143* (2013.01); *H01S 3/105* (2013.01); *H01S 3/1055* (2013.01); *H01S 3/10069* (2013.01)

(58) Field of Classification Search
CPC .... H01S 5/0687; H01S 5/143; H01S 3/10069; H01S 3/1055; H01S 3/105
See application file for complete search history.

(56) References Cited

U.S. PATENT DOCUMENTS 5,771,252 A   6/1998 Lang et al.
6,324,193 B1   11/2001 Bourzeix et al.
(Continued)

FOREIGN PATENT DOCUMENTS

EP    0951112 A2   10/1999
WO   03/005501 A2   1/2003
WO   03/012939 A1   2/2003

*Primary Examiner* — Xinning Niu (57) ABSTRACT

The invention relates to a method for stabilizing a diode laser with a semiconductor laser diode and an external resonator (ECDL), wherein the external resonator is comprised of at least one angle-dispersive, frequency-selective element and wherein the frequency of the diode laser is essentially determined by the length of the external resonator and by the position of the angle-dispersive, frequency-selective element, and wherein these two frequency-selective elements or one element thereof can be detuned by way of a correction means (10) for harmonization to each other, which is characterized in that the portion of the light reflected from the external resonator with the angle-dispersive, frequency-selective element back to the semiconductor laser diode and not optically coupled into the semiconductor laser diode (designated as "non-optically coupled light") or part thereof, is measured and that from the relevant measuring values, after comparison with a reference value, a fault signal is generated which as control variable activates the correction means for synchronization of the frequency-selective elements. Furthermore, the invention relates to device for implementing the method.

24 Claims, 6 Drawing Sheets

(51) Int. Cl.
  *H01S 3/105*    (2006.01)
  *H01S 3/1055*   (2006.01)
  *H01S 3/10*     (2006.01)

(56) References Cited

U.S. PATENT DOCUMENTS

| | | |
|---|---|---|
| 6,912,235 B2 | 6/2005 | Anthon et al. |
| 2001/0005387 A1* | 6/2001 | Yamada .................. H01S 5/141 |
| | | 372/20 |
| 2006/0062262 A1* | 3/2006 | Kubota ................. H01S 5/0683 |
| | | 372/20 |
| 2011/0075689 A1* | 3/2011 | Miyata .................. H01S 5/0654 |
| | | 372/20 |
| 2011/0110388 A1* | 5/2011 | Baroni ...................... H01S 5/10 |
| | | 372/26 |

\* cited by examiner

Fig. 7

METHOD FOR STABILIZING A DIODE LASER

CROSS REFERENCE TO RELATED APPLICATIONS

Applicant claims priority under 35 U.S.C. § 119 of German Application Nos. 10 2014 003 756.8 filed on Mar. 18, 2014, and 10 2015 103 630.4 filed on Mar. 12, 2015, the disclosures of which are incorporated by reference.

The invention relates to a method for stabilizing a diode laser with a semiconductor laser diode and an external resonator (ECDL), wherein the external resonator is comprised of at least one angle-dispersive, frequency-selective element and wherein the frequency of the diode laser is essentially determined by the length of the external resonator and by the position of the angle-dispersive, frequency-selective element, and wherein these two frequency-selective elements or one element thereof can be detuned by way of a correction means for harmonization to each other.

Furthermore, the invention relates to a device for implementing the method with a diode laser comprised of a semiconductor laser diode, at least one collimation lens, an angle-dispersive, frequency-selective element as well as a correction means for offsetting the divergence between the two frequency-selective means "length of the external resonator" on the one hand and "angle position of the angle-dispersive, frequency-selective element" on the other hand.

Accordingly, the angle-dispersive, frequency-selective element can be a prism. In the following, but without restricting generality, an optical diffraction grating is executed as an angle-dispersive, frequency-selective element in a Littrow or Littman configuration.

Various properties of the diode laser advantageously change by external feedback. For example, the bandwidth of the emitted light from the diode laser varies. The typical line width of a free-running diode laser (that means without external resonator) may vary between a few 10 MHz and many GHz. By way of an appropriate external feedback, the line width can be reduced by a plurality of magnitudes. Line widths of less than 10 kHz can partly be realized.

Free-running laser diodes can be detuned by varying the injection current and/or temperature. Mode jumps occur between ranges of a continuous detuning so that it might be impossible to set a desired wavelength.

In a diode laser with external grating feedback, on the contrary, a tuning of the diode laser free of mode jumps in wide ranges can be achieved by varying the external resonator (angle variation and/or length variation) so that every wavelength can be achieved in the entire amplification range of the laser diode.

With diode lasers in a so-called Littrow configuration, the light emitted from the laser diode is collimated by means of collimation optics and diffracted at the optical grating. The light of the zeroth diffraction order is decoupled as effective beam, the light of the first diffraction order, conversely, is reflected back into the laser diode so that the diffraction grating and the end facet of the laser diode form a resonator. With a diode laser in a Littrow configuration, tuning of the wavelength is accomplished by rotating the optical grating. This rotation causes a change in the angle of incidence of the laser beam onto the grating and consequently a variation in the wavelength of the first diffraction order fed back resonantly. In order to detune the diode laser system in a manner free of mode jumps, it is necessary to vary the length of the optical resonator simultaneously with the change in the angle of rotation of the diffraction grating so that the same laser mode prevails constantly in the resonator. Coordinating the change in angle and/or length is possible exactly only if the diffraction grating is turned about a pivot center that is defined by the intersection of the planes of the surface of the optical grating and of the end facet of the laser diode. In practice, however, realizing such a (ideal) pivot point involves substantial expenditure and is only approximately achievable.

Alternatives are diode laser systems in a so-called Littman configuration. Here, the light emitted from the laser diode is also diffracted at an optical grating, but the light of the first order of diffraction is directed onto a mirror which reflects the light back onto the diffraction grating. Together with the end facet of the laser diode, the mirror forms the optical resonator. For tuning the wavelength, the mirror is turned. This rotation causes a change in the angle between the diffracted beam of the first order and the normal of the optical grating, thus defining the resonance condition. However, for mode jump-free tuning of the wavelength, the mirror, too, must be turned about an optimal pivot point, which in practice also requires very extensive mechanical expenditure. With a diode laser with grating feedback, which may be detunable, the frequency-selective elements must be harmonized to each other and/or be detuned synchronously.

Therefore, the invention also relates to a device for precise execution of an adjustment movement of at least one angle-dispersive, frequency-selective element about the (ideal) pivot point, with the device to be of a compact setup.

Known from prior art are various methods for measuring the divergence from grating band pass to external resonator, with all methods having in common that they measure directly or indirectly the quality of the feedback and thus the divergence of the two frequency-selective elements and generate a fault signal therefrom. For example, WO 03/012939 and/or U.S. Pat. No. 6,912,235 disclose a method in which with an ECDL coupled back at the rear facet a fault signal is generated from the ratio of the output power at both sides of the laser.

WO 03/005501 discloses a method for determination of a fault signal from the forward voltage of the laser diode.

U.S. Pat. No. 6,324,193 discloses a method in which a modulation is given to one of the frequency-selective elements and in which the response of intensity to this modulation is evaluated and a fault signal is generated.

Finally, a method is known from EP 0951112 in which a fault signal is generated from the angle divergence of the light fed back versus the light emitted.

However, with the latter method, noticeable optical expenditure is involved which is associated with substantial adjustment issues.

Now, therefore, it is the object of the present invention to handle a method of the nature described hereinabove in such a manner that a correction of divergence can be accomplished continuously with simple means.

This object is achieved by the present invention in that the portion of the light reflected from the external resonator with the angle-dispersive, frequency-selective element back to the semiconductor laser diode which is not optically coupled into the semiconductor laser diode, or part thereof, is measured and that after comparison with a reference value a fault signal is generated from the relevant measuring values that activates as a control variable the correction means for synchronizing the frequency-selective elements. This portion of the light not optically coupled into the semiconductor laser diode is hereinbelow referred to as "non-optically coupled light".

The "non-optically coupled light" or at least part thereof is measured in its intensity statically on operation at a fixed wavelength or dynamically during the tuning process.

The control variable thus obtained activates the correction means in such a manner that a divergence in wavelength which is defined by the angle-dispersive, frequency-selective element is corrected by the wavelength which defines the resonator length.

The invention moreover solves this task by way of a device for which outside the semiconductor laser diode a detector is arranged for detecting and measuring the "non-optically coupled light" falling past the semiconductor laser diode or reflected from the laser diode facet or part thereof which emerges when optically coupling the light filtered by the angle-dispersive, frequency-selective element and reflected back into the semiconductor laser diode, with the detector being connected to a control unit and with this control unit being connected to the correction means.

Accordingly, the invention is based upon the observation that the strength of the "non-optically coupled light" which emerges on optically coupling the feedback light into the laser diode is a measure for the divergence of the two frequency-selective elements, with the intensity of the "non-optically coupled light" also increasing as the divergence of both frequency-selective elements increases. Contemplating an appropriate portion of the "non-optically coupled light", e.g. the one which passes past above the laser diode surface, one gets a measure that with an optimal conformity of the two frequency-selective elements renders a certain amount which becomes greater on divergence of the frequency-selective elements in one direction, and which becomes smaller if the divergence is in the other direction.

According to the present invention, the "non-optically coupled light" or part thereof is picked-up by a power measuring facility and utilized as fault signal for an appropriate controller and an appropriate correction means.

Provided for as a simple measuring facility is a photodiode which picks-up and measures the portion of the "non-optically coupled light" that passes past the laser diode. The photodiode is arranged directly above the laser diode.

An alternative possibility lies in picking-up the portion of the "non-optically coupled light" passing via the laser diode with a lens which is the anyway existing front-side collimation lens of the laser system and to map it on the photodiode.

Another possibility lies in picking-up the "non-optically coupled light" reflected from the laser diode facet, for example with the rear-side collimation lens of the laser system, to map it on the photodiode and to measure it.

According to another embodiment it is provided that the fault signal is standardized to the overall power of the light fed back. Hereby it is for example possible to offset power fluctuations.

Furthermore, it may be provided for that the fault signal is processed with other variables, e.g. the output power of the laser on its two sides or only on one side, the laser diode current, the wavelength and possibly other parameters, and to select them for evaluation.

The power of the "non-optically coupled light" or a part thereof is a measure for the angle divergence of the light fed back and thus a measure for the divergence of the wavelength defined by the angle-dispersive, frequency-selective element from the wavelength defined by the length of the laser resonator.

The measuring values supplied by the photodiode are processed by means of an appropriate algorithm, compared with a reference value, generating the fault signal which serves for activating the correction means, e.g. a piezoactuator, via a controller, advantageously via a PID controller, that adjusts and sets the correct positioning of the grating and/or mirror depending on the magnitude of the fault signal.

Figure 1:
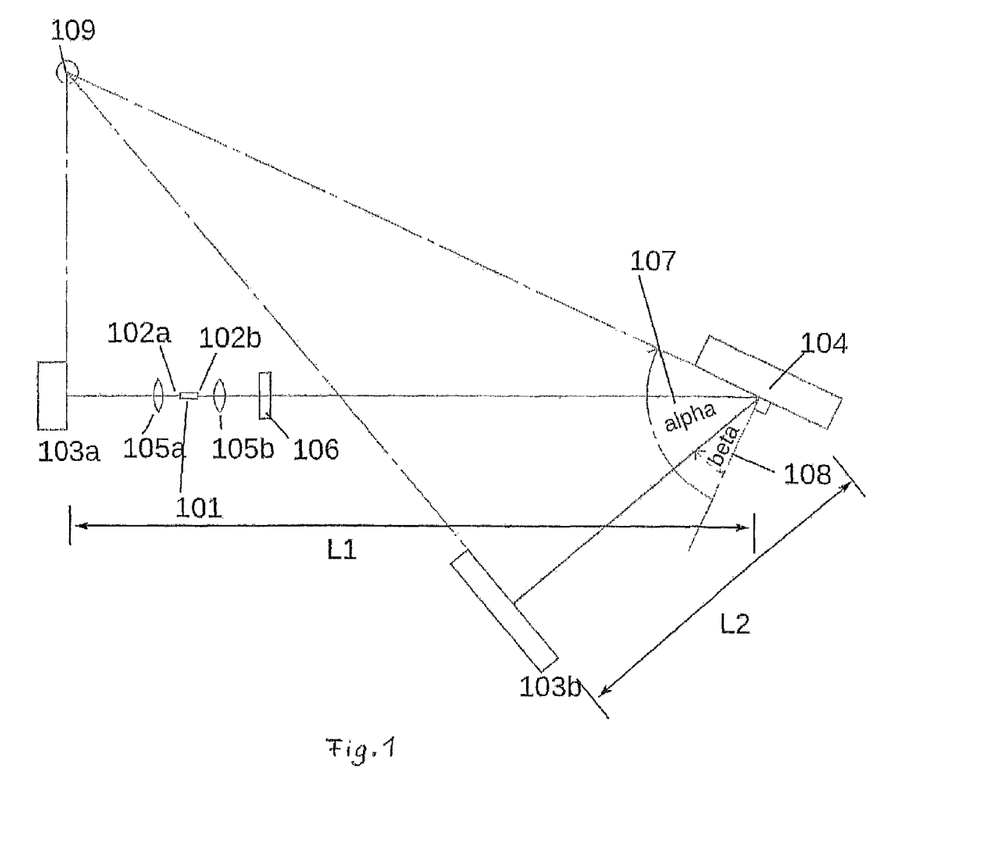
FIG. 1: shows a principle setup of a tunable laser with an external resonator.

Based on FIG. 1, a tunable diode laser with an external resonator is explained.

As already stated hereinabove, a tunable laser with an external resonator is comprised of an amplifying medium (semiconductor laser diode) with two end facets (102a, b), at least two resonator mirrors (103a, b), whereof one can be mounted on one of the end facets. Furthermore, the laser resonator is comprised of at least one angle-dispersive element (104), which transmits or reflects part of or the entire incident power at an angle which depends on the wavelength. The angle-dispersive element can simultaneously be one of the resonator mirrors. The resonator may be comprised of further optical elements for collimation (105), for turning the polarization (106) etc.

The optical elements are so arranged that a closed resonator is obtained at the desired laser frequency. The desired laser frequency $f_{laser}$ results from two conditions: $f_{length}$ and $f_{alpha}$. One condition $f_{length}$ is given by the optical length L' of the resonator with $f_{length}$=N*FSR, wherein N is an integral number and wherein the free spectral range is FSR=½*c/L'. For example, L' is the sum of $L_1$' and $L_2$', which in turn result from the geometrical lengths $L_1$ and $L_2$ and from the diffraction indices of the materials in the beam path.

Condition $f_{alpha}$ is given by the light frequency at which the light due to the angle dispersion of the at least one angle-dispersive element (104) after a single pass through the resonator again passes on the same path, i.e. the resonator is closed. With a laser in a Littrow configuration, for example, this is $c/f_{alpha}*D=2*\sin(alpha)$ with the grating constant D and the angle of incidence alpha on the grating. With the example outlined here, i.e. a laser in a Littman configuration, $c/f_{alpha}*D=\sin(alpha)+\sin(beta)$ with D of the grating constant and alpha and beta (108) of the angles of incidence and reflection on the grating.

For the optimal operation of the laser, the frequency $f_{alpha}$, which is adjusted and set via the angle(s), coincides with the frequency $f_{length}$ of one of the modes of the laser resonator. However, both conditions evidence a certain blur so that the laser will also function with a minor detuning. An exemplary execution of such a laser would be a diode laser in a Littrow or Littman configuration.

To be able to tune the laser over a wider range, one of the optical elements must be moved so that a closed resonator will result at a certain frequency $f_{alpha2}$. To detune the laser continuously, the resonator length must be varied at the same time so that the frequency of the originally selected mode varies in the same measure, thus still being valid: $f_{alpha2}=f_{length2}$.

The desired tuning behaviour can be achieved by moving at least one optical element about an appropriate rotation point (109) (also called pivot point). The choice of this pivot point is known from prior literature and is not explained hereinbelow any further (see U.S. Pat. No. 5,771,252).

If the pivot point (109) is not chosen ideally, mode jumps will occur when tuning the laser. This can be corrected by moving the same or another optical element additionally in an appropriate manner. This procedure, too, is known from prior literature (for example U.S. Pat. No. 6,324,193).

The movement of the optical element about the pivot point must be accomplished very precisely and evenly so that the laser frequency, too, can be adjusted precisely and evenly. Furthermore, the mechanical setup must be so designed that undesired movements that would perturb the laser frequency are suppressed to the greatest possible extent. In the example outlined, the angle-dispersive element (104) is a reflection grating.

The present invention solves this task according to further embodiments in such a way that the at least one optical element is arranged on a carrier which is connected via joint units to a base body, wherein an actuator supported at the base body and controlled by the control unit attacks at the carrier and twists the carrier against the base body, with the pivot point of the carrier lying outside the plane spanned by the joint units.

By way if this arrangement, it is ensured that the carrier can only move about the pivot point. Since the joints span-up an area, this configuration is stiff versus movements in a non-desired direction. The system has a higher resonance frequency and better stability versus acoustic interferences.

Furthermore, the pivot point lies outside the area spanned-up by the joints and thus the unit can be executed as a noticeably more compact unit, therefore it can be thermally stabilized in a better way.

According to a further embodiment, it is provided for to arrange four joints, thereof two each being mounted at the base body and two at the carrier, and one joint each arranged at the base body and at the carrier are connected to each other via a lever, thus forming two joint units arranged symmetrically towards each other.

Accordingly, solid-state joints are advatangeously provided for as joints.

In a further embodiment, it is provided for that the actuator causing the rotating movement acts by means of a coupling element on the carrier.

Accordingly, the coupling element is advantageously stiff in the desired direction of movement, it means it transfers the desired force to the carrier, and it is soft in other directions, thus transferring only minor forces into non-desired directions.

For example, the coupling element can be a rod at whose ends one ball bearing each is provided for by means of which it is connected to the carrier on the one hand and to the actuator on the other hand.

In an advantageous embodiment, the actuator is a piezoactuator.

In another embodiment, the optical element is movably mounted at the carrier and by means of another actuator it can additionally be moved about a point which is not the pivot point. By way of this additional movement, a divergence, if any, of the realized turning point versus the theoretically optimal pivot point can be offset.

With some advantage, the optical element is turned about its center so that the resonator length varies just negligibly.

In another advantageous embodiment, the optical element is only shifted so that only the resonator length varies.

In another embodiment, the slow wide tuning of the laser is separated from the fast, fine tuning by moving two optical elements, for example the mirror and the grating in a Littman configuration. Accordingly, the slow wide tuning is moved with the afore-described mechanism.

The device according to a further embodiment is not only applicable to the method and device according to one aspect of the invention, but in general to diode lasers with an external resonator.

The invention is now elucidated in the following by way of drawings, where.

Figure 2:
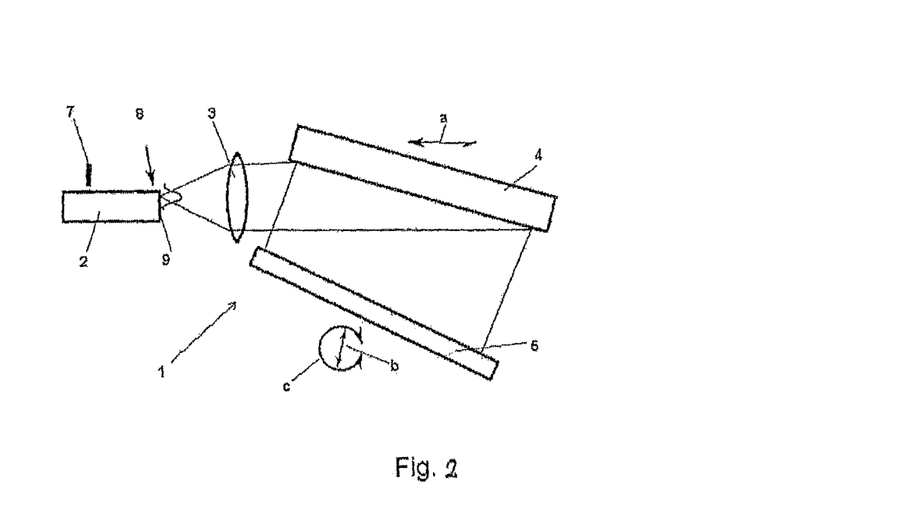
FIG. 2: shows a principle measuring setup of a diode laser with an external resonator according to the inventive method.
Figure 3:
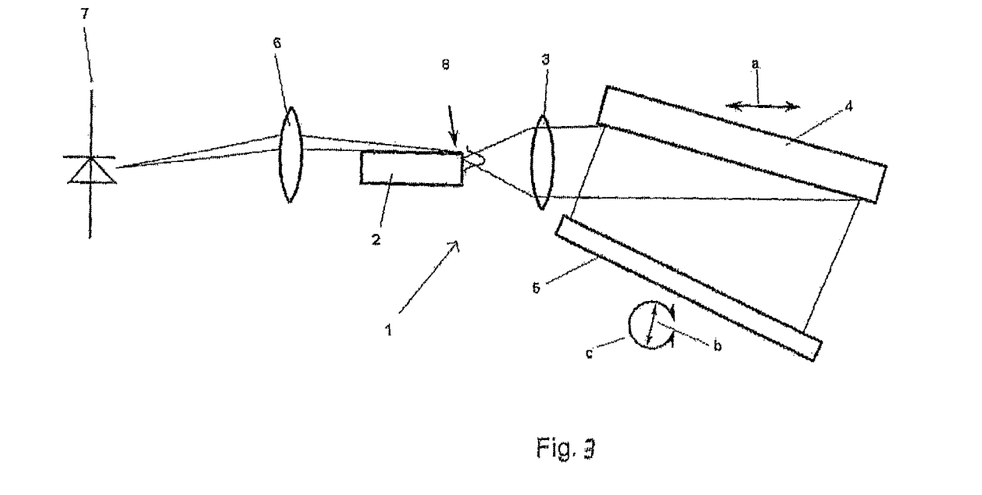
FIG. 3: shows an alternative setup of the diode laser according to FIG. 2.

In a simplified representation, FIGS. 2 and 3 show a diode laser which is generally designated with reference number 1.

It is comprised of a semiconductor laser diode 2, at least one collimation lens 3, an optical grating 4, and a mirror 5 arranged opposite the grating 4.

While FIG. 2 merely illustrates the rear-side collimation lens 3, FIG. 3 also shows the front-side collimation lens 6.

As elucidated by the arrows a, b and c, the grating-mirror arrangement 4, 5 is adjustable in longitudinal direction (a), in transverse direction (b) and/or rotatorily about an axis (c). This adjustability serves for correcting a divergence in wavelength, which is defined by the angle-dispersive, frequency-selective element, from the wavelength that is defined by the resonator length. It is accomplished through a correction means not shown here, e.g. a piezoactuator. In the concrete case, only movement c is realized.

In FIG. 2, above the semiconductor laser diode 2, a photodiode 7 is indicatively traced.

The collimation lens 3 parallelizes the light emitted from laser diode 2 and lets it fall obliquely onto the grating 4 where it is diffracted, with the light of the zeroth diffraction order being decoupled as effective beam via the mirror 5, whereas the light diffracted in the first order hits onto the mirror. From there, it is reflected via the grating and the collimation lens 3 back into the laser diode 2.

The end facet of the laser diode 2 together with the mirror 5 thus forms a resonator.

It is a Littman configuration.

As long as the optical coupling-in point of the light reflected back from the mirror 5 lies centrally on the facet of the laser diode 2, the wavelength defined by the resonator length and the wavelength prompted by the mirror position angle are synchronous to each other, and the laser is tunable in a manner free of mode jumps.

As shown in FIGS. 2 and 3, due to the wavy optical beam form, a minor portion of the light reflected back to the laser diode facet 9 always passes past the laser diode 2. The portion of the light passing by depends on the exact position of the focus on the laser diode facet 9, with this position being dependent on the detuning of the two frequency-selective elements, i.e. grating and resonator length. Thus, the intensity of the light passing by is dependent upon the detuning of the two frequency-selective elements, i.e. grating and resonator length.

Figure 3A:
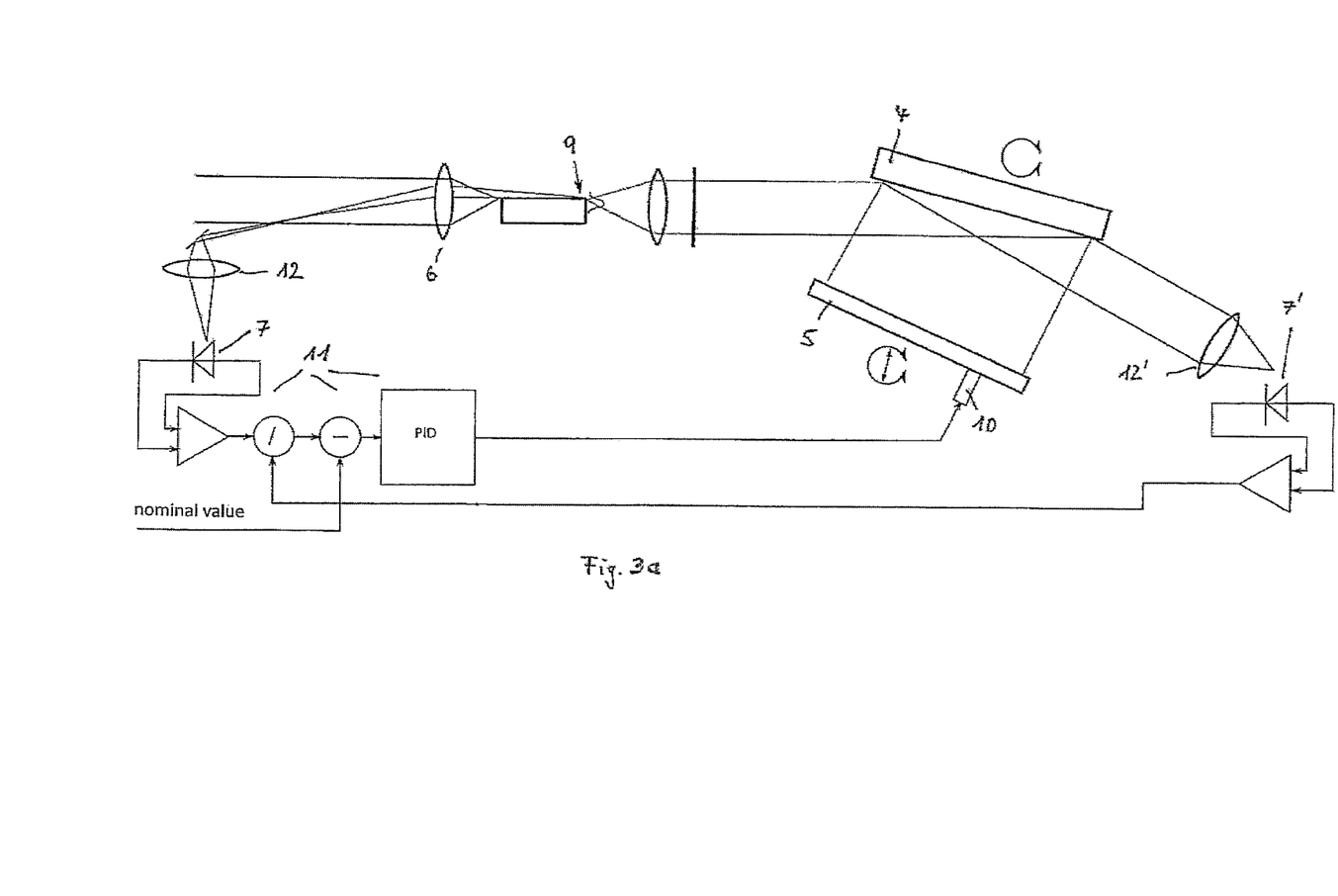
FIG. 3a: shows a device according to FIG. 3 in supplemented form.

In FIG. 3, this scattered light, contrary to the embodiment shown in FIG. 2, is mapped via the front-side collimation lens 6 on a photodiode 7 arranged downstream of laser diode 2. The photodiodes 7 measure the power of the scattered light falling past the laser diode. The measured values are compared with a reference value and thereof, a fault signal is generated by means of an appropriate algorithm. For example, this fault signal is amplified by way of a PID amplifier 11 (see FIG. 3$^a$). Its output signal constitutes the control variable for activating the piezoactuator which adjusts and sets the grating-mirror combination in such a manner that the desired synchronism of grating band pass and resonator length is restored, i.e. the light reflected back from the grating again falls onto the center of facet 9.

In FIG. 3$^a$, with the device illustrated in FIG. 3, the beam path via the collimation lens 6 is so modified that it is directed via a mirror 13 and another lens 12 to the photodiode 7.

On the right side of this figure, the portion of scattered light reflected back from facet 9 is directed via the grating 4 and another lens 12' to a photodiode 7'. Both the photodiode 7 and the photodiode 7' supply the measuring values from which after comparing them with the reference value (design value), a fault signal is generated which after amplification in the PID amplifier 11 serves as control variable.

Figure 4:
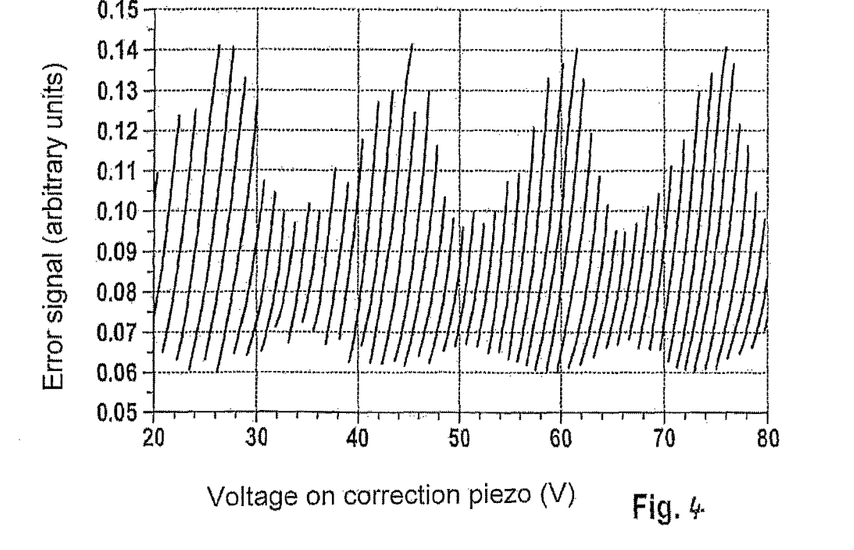
FIG. 4: shows a fault signal dependent on the voltage of the correcting piezoactuator.
Figure 5:
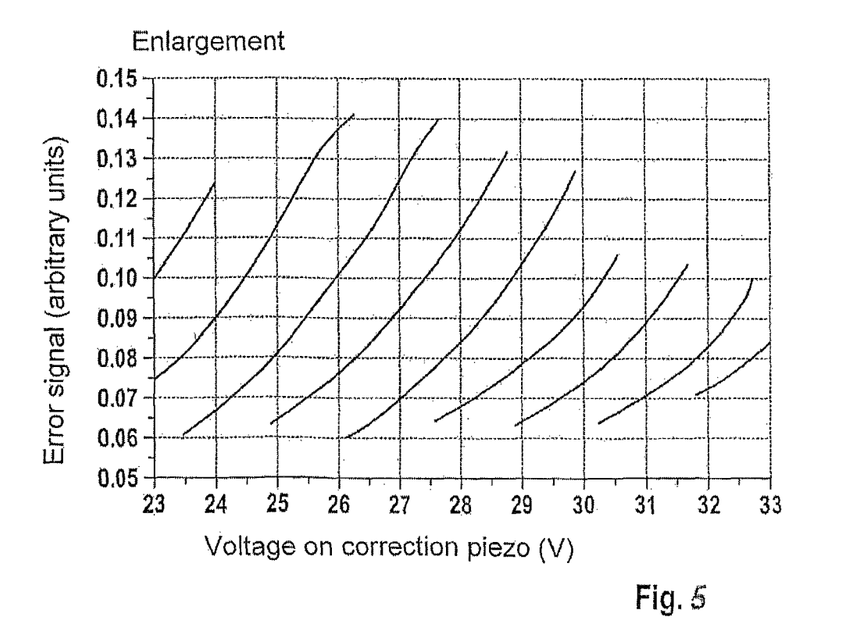
FIG. 5: shows a magnified extract from FIG. 4.

In FIGS. 4 and 5, the fault signal (in arbitrary units) is plotted versus the corrective piezo voltage.

In this case, for the sake of clarity, the fault signal is recorded by scanning, for example mirror 5, in such a manner that starting from a point within the plateau, scanning is accomplished consecutively in both directions until a mode jump, and then chaining these data together. After a plateau has been completely scanned, the next is measured. The measurements of many plateaus are chained together in FIGS. 3 and 4. Here, a periodical contraction can be well recognized whose cause is the internal mode of the laser diode.

Just by way of a continuous measurement of the scattered light occurring on reflection of the light from the grating back into the laser diode is it feasible to monitor and readjust the synchronism of both frequency-selective elements (resonator length and grating position).

Figure 6:
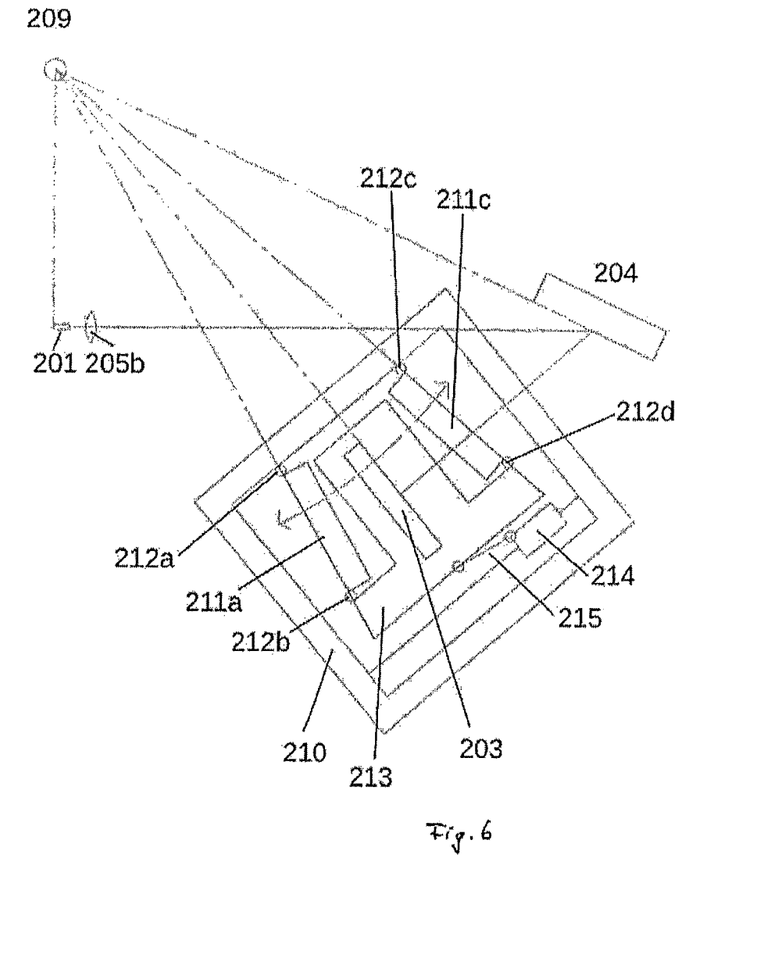
FIG. 6: shows a device for moving the optical element relative to the ideal pivot point.

In FIG. 6, a special embodiment of a diode laser 200 with an external resonator is illustrated, wherein the diode laser is comprised of a laser diode (201) and at least one collimation lens (205*b*) and essentially of one angle-dispersive element (204) and a mirror (203) which is swivable about a pivot point (209).

The optical element (mirror, grating) (203) which is to be moved about the pivot point (209) is mounted on a carrier (203). This carrier is connected through at least two joint units (212*a*, 211*a*, 212*b*) and/or (212*c*, 211*c*, 212*d*) with a base body (210). A joint unit is comprised of a lever (211*a* and/or 211*c*), at both ends of which one joint each (212*a*, *b* and/or 212*c*, *d*) is mounted. One of these joints (212*b* and/or 212*d*) is connected to the carrier (213), the second (212*a* and/or 212*c*) is connected to the base body (210). The joint units are so arranged that the carrier (213) moves about the pivot point (209) which lies outside the area spanned-up by the joint units.

By way of this configuration, it is ensured that the carrier can only move about the pivot point. Since the joints span-up an area, this configuration is noticeably stiffer to movements in a non-desired direction. The system has higher resonance frequency and better stability versus acoustic interferences.

Furthermore, the pivot point lies outside the area spanned-up by the joints and thus the unit can be of a substantially more compact setup than in prior art and therefore, it can be stabilized thermally in a better manner.

Provided for is an actuator (214) which acts by means of a coupling element (215) on the carrier (213) and which is supported at the base body (210). The coupling element (215) is stiff in the desired direction of movement, that means it transfers the desired force to the carrier (213), and it is stiff in other directions. It means it transfers only minor forces into non-desired directions. The coupling element (215), for example, can be a rod which at its ends is linked by a ball joint to the carrier (213) and/or actuator (214).

Figure 7:
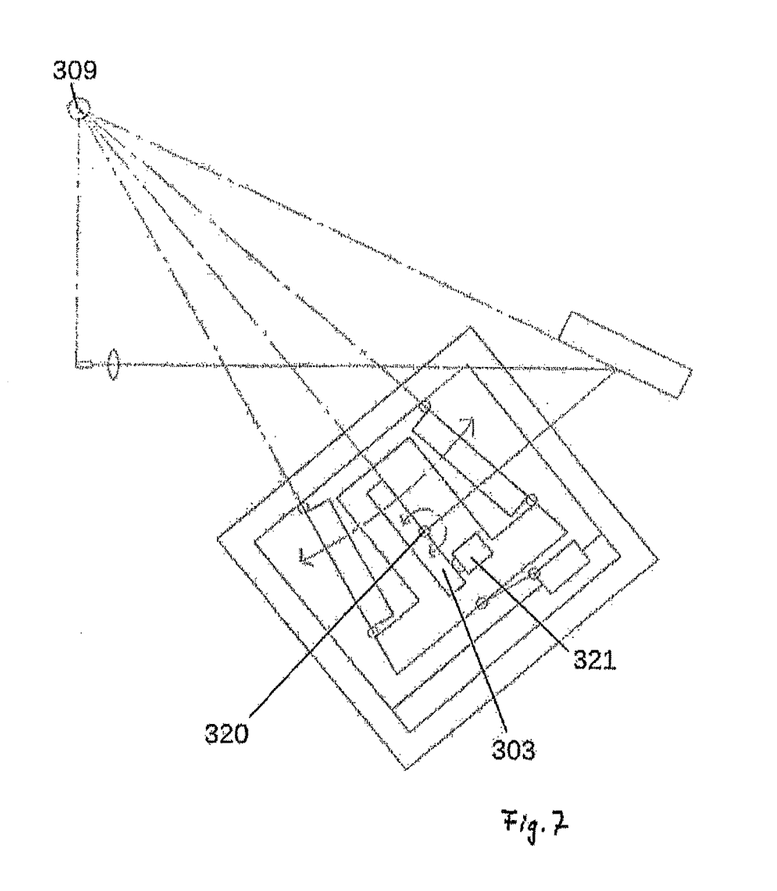
FIG. 7: shows a device according to FIG. 6 in an expanded form.

In another embodiment according to FIG. 7, the optical element (203) is movably mounted at the carrier (213) and can be moved by another actuator (321) additionally about a point (320) that is not the pivot point (309). By way of this additional movement, a divergence, if any, of the realized rotation point (309) versus the theoretically optimal pivot point can be offset.

The invention claimed is:

1. A method for stabilizing a diode laser with a semiconductor laser diode, a laser diode facet at an end of the semiconductor laser diode, and an external resonator, wherein the external resonator comprises at least one angle-dispersive, frequency-selective element, wherein the frequency of the diode laser is essentially determined by the length of the external resonator and by the position of the angle-dispersive, frequency-selective element, wherein these two frequency-selective elements or one element thereof can be detuned by way of a correction device, wherein a portion of the light reflected from the external resonator with the angle-dispersive, frequency-selective element back to the laser diode facet at the end of the semiconductor laser diode and not optically coupled by the laser diode facet into the semiconductor laser diode, or part thereof, is scattered by the laser diode facet in dependence on a focus position of the light reflected on the laser diode facet, falling past the semiconductor laser diode onto a detector arrangement arranged beside the semiconductor laser diode without entering into the semiconductor laser diode, and is measured for controlling the diode laser, and wherein from the relevant measuring values, after comparison with a reference value, a fault signal is generated which as a control variable activates the correction device for synchronization of the frequency-selective elements.

2. The method according to claim 1, wherein by way of the correction device a divergence of the wavelength defined by the angle-dispersive, frequency-selective element is corrected by the wavelength which defines the resonator length.

3. The method according to claim 1, wherein the angle-dispersive, frequency-selective element is an optical grating.

4. The method according to claim 1, wherein the angle-dispersive, frequency-selective element is a prism.

5. The method according to claim 1, wherein the portion of the non-optically coupled light reflected from the laser diode facet is directed from a rear-side collimation lens of the diode laser onto a further detector and is measured.

6. The method according to claim 1, wherein the fault signal is standardized to the overall power of the back-coupled light.

7. The method according to claim 1, wherein further signals such as intensity of the diode laser on one of its two sides or on both sides and/or laser diode current and/or wavelength and/or voltage and/or other parameters are selected for evaluation.

8. A device for implementing the method according to claim 1 with a diode laser, the device comprising:
a semiconductor laser diode,
a laser diode facet at an end of the semiconductor laser diode, at least one collimation lens, at least one angle-dispersive, frequency-selective element, a correction device for offsetting the divergence between the two frequency-selective elements, a control unit connected to the correction device, and a detector arranged outside the semiconductor diode to detect and measure the non-optically coupled light scattered by the laser diode facet in dependence on a focus position of the light reflected on the laser diode facet, falling past the semiconductor laser diode or reflected from the laser diode facet, or a part thereof, which emerges without entering into the semiconductor laser diode on optical coupling by the laser diode facet of the light filtered by the angle-dispersive, frequency-selective element and reflected back into the laser diode facet at the end of the semiconductor laser diode, the detector being arranged beside the semiconductor laser diode, wherein the detector is connected to the control unit, and wherein part of the non-optically coupled light scattered by the laser diode facet at the end of the semiconductor laser diode onto the detector without entering into the semiconductor laser diode is measured for controlling the diode laser.

9. The device according to claim 8, wherein the detector is arranged above the semiconductor laser diode.

10. The device according to claim 8, wherein the detector is arranged upstream to the front-side collimation lens in such a manner that the front-side collimation lens directs the "non-optically coupled light" scattered by the laser diode facet without entering into the semiconductor laser diode onto the detector.

11. The device according to claim 8, wherein the detector is a photodiode.

12. The device according to claim 8, wherein the control unit comprises a PID amplifier.

13. The device according to claim 8, wherein the correction device is a piezoactuator.

14. The device according to claim 8, wherein the at least one angle-dispersive element is arranged on a carrier which is connected via joint units to a base body, and wherein an actuator supported at the base body and controlled by the control unit attacks at the carrier and twists the carrier against the base body, with the pivot point of the carrier lying outside the plane spanned by the joint units.

15. The device according to claim 14, wherein four joints are arranged, thereof two joints each being mounted at the base body and two at the carrier, and wherein one joint each mounted at the base body and at the carrier are connected to each other by way of a lever.

16. The device according to claim 14, wherein the joints are solid-state joints.

17. The device according to claim 14, wherein the actuator acts via a coupling element on the carrier.

18. The device according to claim 17, wherein the coupling element is configured stiff in the direction of motion as well as soft in other directions.

19. The device according to claim 17, wherein the coupling element is a rod, at each end of which one ball joint is arranged, and wherein via the one ball joint the rod is connected to the carrier and to the actuator.

20. The device according to claim 14, wherein the optical element is movably mounted at the carrier and can be moved with another actuator about a point which is not the pivot point.

21. The device according to claim 14, wherein the optical element is slidable for changing the resonator length.

22. A method for stabilizing a diode laser with a semiconductor laser diode, a laser diode facet at an end of the semiconductor laser diode, and an external resonator, wherein the external resonator comprises at least one angle-dispersive, frequency-selective element, wherein the frequency of the diode laser is essentially determined by the length of the external resonator and by the position of the angle-dispersive, frequency-selective element, wherein these two frequency-selective elements or one element thereof can be detuned by way of a correction device, wherein a portion of the light reflected from the external resonator with the angle-dispersive, frequency-selective element back to the laser diode facet at the end of the semiconductor laser diode and not optically coupled by the laser diode facet into the semiconductor laser diode, or part thereof, is scattered by the laser diode facet in dependence on a focus position of the light reflected on the laser diode facet, falling past the semiconductor laser diode and directed by a collimation lens positioned on a front side of the semiconductor diode laser onto a detector arrangement without entering into the semiconductor laser diode, and is measured for controlling the diode laser, and wherein from the relevant measuring values, after comparison with a reference value, a fault signal is generated which as a control variable activates the correction device for synchronization of the frequency-selective elements.

23. A device for implementing the method according to claim 1 with a diode laser, the device comprising:

a semiconductor laser diode, a laser diode facet at an end of the semiconductor laser diode, a first collimation lens positioned at a front side of the semiconductor laser diode, at least one angle-dispersive, frequency-selective element, a correction device for offsetting the divergence between the two frequency-selective elements, a control unit connected to the correction device, and a detector arranged outside the semiconductor diode to detect and measure the non-optically coupled light scattered by the laser diode facet in dependence on a focus position of the light reflected on the laser diode facet, falling past the semiconductor laser diode or reflected from the laser diode facet, or a part thereof, which emerges without entering into the semiconductor laser diode on optical coupling by the laser diode facet of the light filtered by the angle-dispersive, frequency-selective element and reflected back into the laser diode facet at the end of the semiconductor laser diode, wherein the detector is connected to the control unit, wherein part of the non-optically coupled light scattered by the laser diode facet at the end of the semiconductor laser diode is directed by the first collimation lens onto the detector without entering into the semiconductor laser diode and is measured for controlling the diode laser.

24. The device according to claim 23, further comprising a second detector and a second collimation lens disposed on a rear-side of the diode laser,
> wherein the second detector is arranged downstream of the second collimation lens of the diode laser in such a manner that the second collimation lens directs the "non-optically coupled light" reflected from the laser diode facet at the end of the semiconductor laser diode onto the second detector.

* * * * *